(12) United States Patent
Saito et al.

(10) Patent No.: US 7,129,530 B2
(45) Date of Patent: Oct. 31, 2006

(54) SEMICONDUCTOR DEVICE

(75) Inventors: Koichi Saito, Gifu-ken (JP); Yoshikazu Ibara, Gifu-ken (JP); Tatsuhiko Koide, Gifu-ken (JP); Daichi Suma, Gifu-ken (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 11/237,834

(22) Filed: Sep. 29, 2005

(65) Prior Publication Data

US 2006/0071239 A1   Apr. 6, 2006

(30) Foreign Application Priority Data

Sep. 29, 2004 (JP) ............................. 2004-283183
Aug. 31, 2005 (JP) ............................. 2005-250701

(51) Int. Cl.
*H01L 29/739* (2006.01)

(52) U.S. Cl. ............... 257/197; 257/616; 257/E29.188; 257/E29.193

(58) Field of Classification Search ............... 257/197, 257/616

See application file for complete search history.

(56) References Cited

FOREIGN PATENT DOCUMENTS

JP          04-179235           6/1992

*Primary Examiner*—Minhloan Tran
*Assistant Examiner*—Eduardo A. Rodela
(74) *Attorney, Agent, or Firm*—McDermott Will & Emery LLP

(57) ABSTRACT

A high capacity semiconductor device having a narrowed emitter layer. The semiconductor device includes a collector layer formed on a semiconductor substrate. An SiGe alloy layer is formed on the collector layer. A silicon film is formed on the SiGe layer. An emitter electrode is formed on the silicon film. A side wall film covers the side surface of the emitter electrode. The bottom surface of the emitter electrode is located above the lower surface of the side wall film. Part of the second region of the silicon film is located between the SiGe alloy layer and the side wall film. An impurity region is formed adjacent to the conductive layer. A silicide film is formed along the side surface of the second region, the side surface of the conductive layer, and the surface of the impurity region.

14 Claims, 7 Drawing Sheets

SEMICONDUCTOR DEVICE

CROSS-REFERENCE TO RELATED APPLICATIONS

This application is based upon and claims the benefit of priority from prior Japanese Patent Applications No. 2004-283183, filed on Sep. 29, 2004, and No. 2005-250701, filed on Aug. 31, 2005, the entire contents of which are incorporated herein by reference.

BACKGROUND OF THE INVENTION

The present invention relates to a semiconductor device.

Portable electronic devices, such as cellular phones, PDAs, DVCs, and DSCs, have become to be provided with a larger number of functions. Further, there are demands for compact and portable electronic devices. To satisfy such demands, highly integrated system LSIs are necessary.

One example of a module that realizes a high integration system LSI is a high frequency bipolar transistor. To increase the performance of a high frequency high polar transistor, a silicon-germanium (SiGe) heterojunction bipolar transistor has been proposed. Japanese Laid-Open Patent Publication No. 4-179235 describes the manufacturing of a bipolar transistor in the prior art.

The manufacturing of an SiGe heterojunction bipolar transistor will now be described with reference to FIGS. 13 and 14.

Referring to FIG. 13, an n$^+$ type collector embedment layer 101 is formed on a p$^-$ type silicon substrate (not shown). An n$^-$ type layer 102 (epitaxial layer), which functions as a collector layer, is formed on the n$^+$ type collector embedment layer 101. The n$^-$ type layer 102 is etched and removed excluding portions required for use as the collector layer and a collector extraction layer. An element isolation region includes a trench, of which the surface is covered by an oxidation film 103, and a polycrystalline silicon film 104, which is embedded in the trench. After the formation of the collector and element isolation region, a flat oxidation film 105 (embedment oxidation film) is formed on the surface of the substrate. A p-type SiGe layer 106 (SiGe alloy layer), which functions as an internal base layer, is formed on the oxidation film. Then, an n-type silicon layer 107, which functions as an emitter layer, and an n$^+$ type silicon layer 108, which functions as an emitter-contact layer (emitter electrode), are epitaxially grown on the p-type SiGe layer 106. While using an oxidation film 109 as a mask, the n$^+$ type silicon layer 108 and the n-type silicon layer 107 are etched and removed excluding portions required to form the emitter. The outer side of the region functioning as the internal base layer in the residual p-type SiGe layer 106 is etched for a predetermined depth using an oxidation film (side wall film) 110 and the oxidation film 109 as masks. This portion then undergoes selective epitaxial growth to form a p$^+$ type SiGe layer 111, which functions as an external base layer.

In the SiGe base heterojunction bipolar transistor configuration of the prior art, the n-type silicon layer 107 (emitter layer) includes a relatively narrow upper surface and a relatively wide lower surface. The width of the lower surface of the emitter layer is about the same as the outer dimension ($W_{e2}$) of the side wall film 110. Accordingly, the width $W_{e2}$ of the emitter-base junction, which is located below the n-type silicon layer 107, is much greater than the width $W_{e1}$ of the n$^+$ type silicon layer 108 (emitter electrode).

To manufacture a semiconductor device (SiGe base heterojunction bipolar transistor) having higher capacities, the n$^+$ type silicon layer 108 (emitter electrode) must further be processed in a miniaturized manner to decrease the width $W_{e1}$, which would further decrease the width $W_{e2}$ of the emitter layer. However, this would result in the need of a highly accurate exposure apparatus and thus increase manufacturing costs.

SUMMARY OF THE INVENTION

It is an object of the present invention to provide a high capacity semiconductor device having a narrowed emitter layer.

One aspect of the present invention is a semiconductor device including a semiconductor substrate. A collector layer is formed on the semiconductor substrate. A silicon-containing conductive layer is formed on the collector layer and including a side surface. A silicon film is formed on the conductive layer and includes a first region, which functions as an emitter layer, and a second region including a side surface. An emitter electrode is formed on the silicon film and includes a side surface and a bottom surface, in which the bottom surface contacts the first region of the silicon film. A side wall film covers the side surface of the emitter electrode and includes a lower surface. The bottom surface of the emitter electrode is further from the substrate than the lower surface of the side wall film. At least part of the second region of the silicon film is located between the conductive layer and the side wall film and contacts both the conductive layer and the side wall film. An impurity region containing silicon is formed adjacent to the conductive layer. The impurity region functions as an external base layer and includes a surface. A silicide film is formed along the side surface of the second region, the side surface of the conductive layer, and the surface of the impurity region.

Another aspect of the present invention is a semiconductor device including a semiconductor substrate. A collector layer is formed on the semiconductor substrate. A silicon-containing conductive layer formed on the collector layer and including a side surface. A silicon film is formed on the conductive layer and includes a first region, which functions as an emitter layer, and a second region including a side surface. An emitter electrode is formed on the silicon film and includes a side surface and a bottom surface, in which the bottom surface contacts the first region of the silicon film. A side wall film covers the side surface of the emitter electrode and includes a lower surface. The bottom surface of the emitter electrode is further from the substrate than the lower surface of the side wall film. At least part of the second region of the silicon film is located between the conductive layer and the side wall film and contacts both the conductive layer and the side wall film. An impurity region containing silicon is formed adjacent to the conductive layer. The impurity region functions as an external base layer and includes a surface. A silicide film is formed along the side surface of the second region and the surface of the impurity region.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
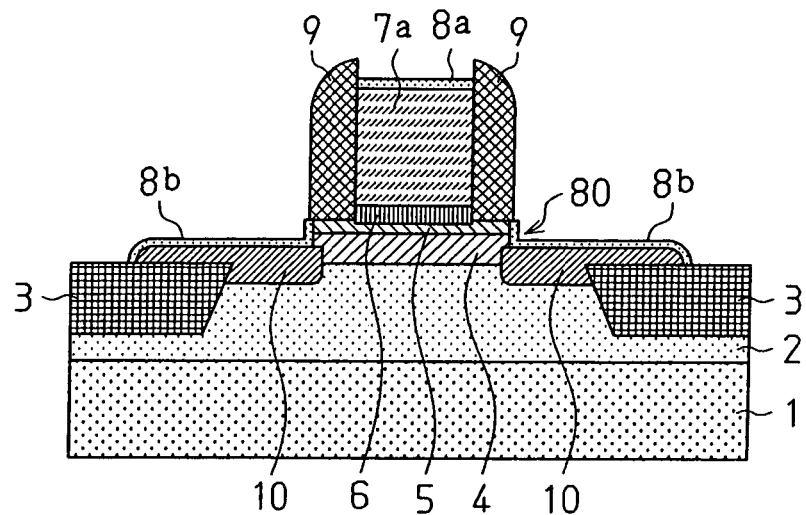
FIG. 1 is a cross-sectional view showing a semiconductor device according to a preferred embodiment of the present invention.
Figure 2:
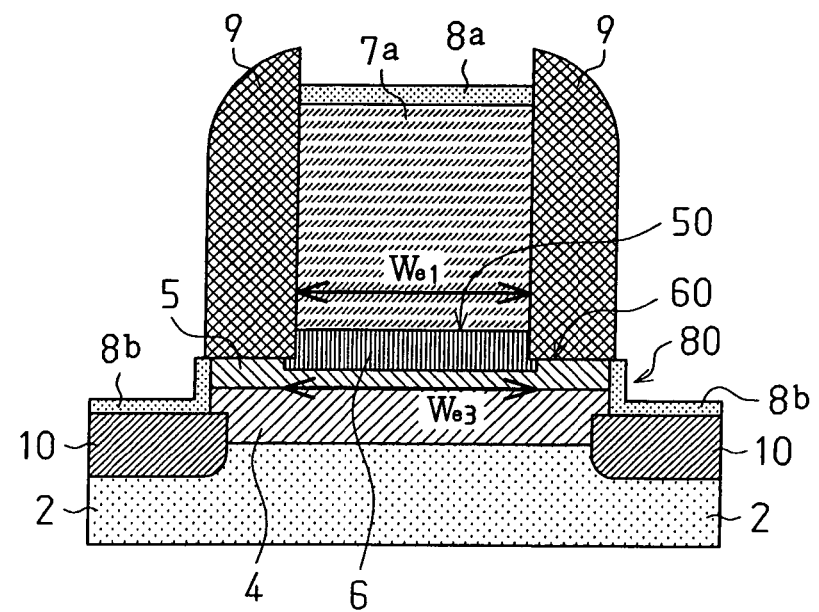
FIG. 2 is an enlarged partial view showing the semiconductor device of FIG. 1.

A semiconductor device according to a preferred embodiment of the present invention will now be discussed with reference to FIGS. 1 and 2. The semiconductor device of FIG. 1 is an SiGe base heterojunction bipolar transistor.

Figure 8:
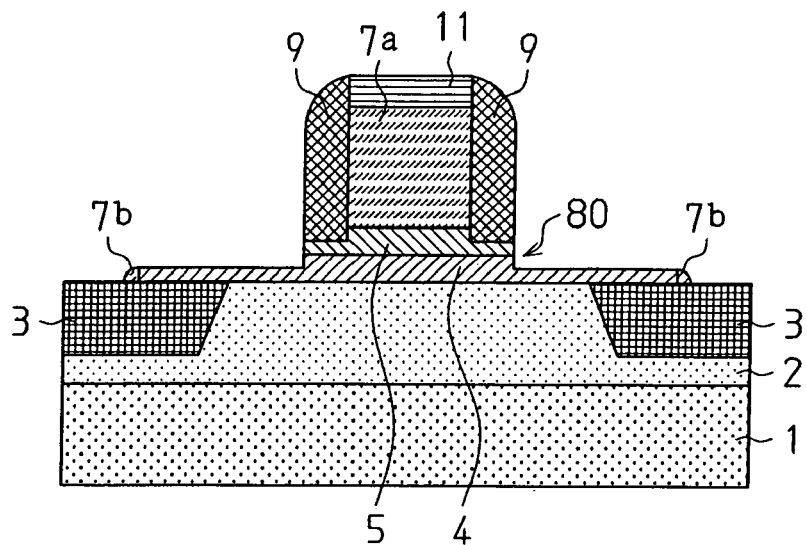

An epitaxial layer 2, which functions as a collector layer, is formed on a silicon substrate 1. Element isolation regions 3 are formed in parts of the epitaxial layer 2 by performing shallow trench isolation (STI). An SiGe alloy layer 4, which functions as a base region, is formed on the epitaxial layer 2. A silicon film 5 is formed on the SiGe alloy layer 4. An n-type diffusion layer 6 is formed by diffusing n-type impurities into the silicon film 5. More specifically, the silicon film 5 has a reversed T-shaped cross-section, as shown in FIG. 8. The n-type diffusion layer 6 is formed by dispersing n-type impurities on the projecting upper portion of the silicon film 5.

A polycrystalline silicon film 7a is formed on the n-type diffusion layer 6. A silicide film 8a is formed on the polycrystalline silicon film 7a. An insulative side wall film 9 (side wall) covers the n-type diffusion layer 6, the polycrystalline silicon film 7a, and the side surface of the silicide film 8a. The side wall film 9 is, for example, a silicon oxide.

A contact surface 50 defined between the n-type diffusion layer 6 and the polycrystalline silicon film 7a, that is, the bottom surface of the polycrystalline silicon film 7a, is located at a position higher than the lower surface of the side wall film 9. The silicon film 5, which is arranged between the side wall film 9 and the SiGe alloy layer 4, includes a peripheral portion contacting the lower surface 60 of the side wall film 9 and the upper surface of the SiGe alloy layer 4. A p$^+$ diffusion layer 10, which functions as an outer base layer, is formed at the outer side of a region functioning as an internal base layer in the SiGe alloy layer 4. A silicide film 8b, which functions as a resistor layer of an external base layer, is formed on the surface of the p$^+$ diffusion layer 10. The silicide film 8b, which has an L-shaped cross-section, includes an elevated wall 80 covering the side surface of the silicon film 5 and the side surface of the SiGe alloy layer 4.

The SiGe alloy layer 4 is an example of a silicon-containing conductive layer. The n-type diffusion layer 6 is an example of a first region. The silicon film 5 excluding the n-type diffusion layer 6 is an example of a second region. The polycrystalline silicon film 7a is an example of an emitter electrode. The p$^+$ diffusion layer 10 is an example of an impurity region.

Figure 14:
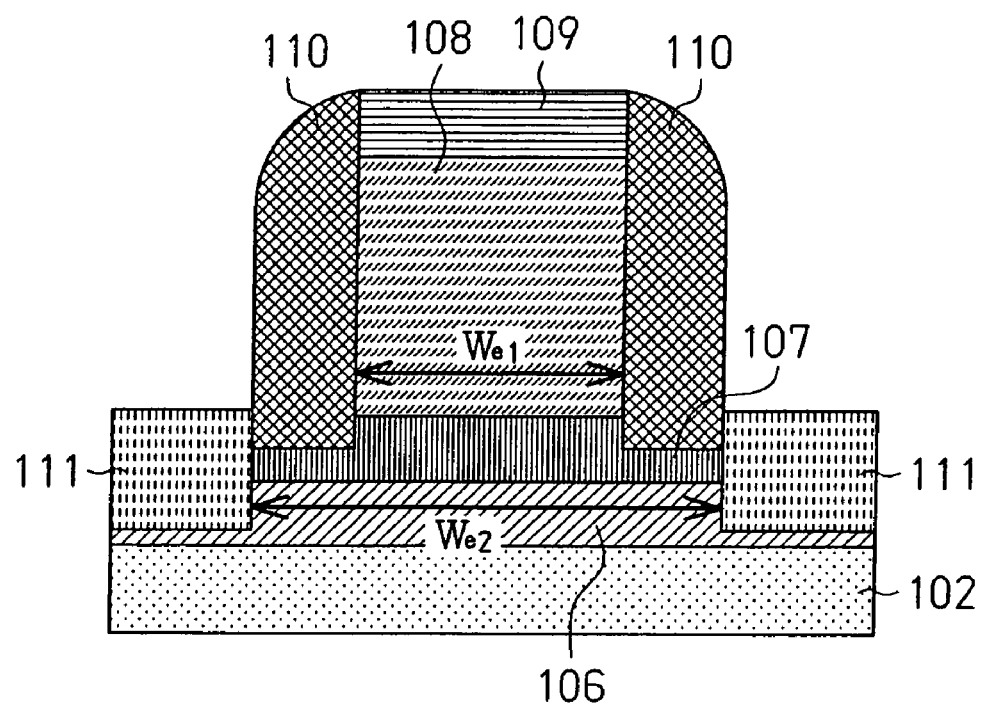
FIG. 14 is an enlarged partial view showing the transistor of FIG. 13.

In the semiconductor device of the prior art, the width of the emitter-base junction is W$_{e2}$, as shown in FIG. 14. Comparatively, in the semiconductor device of the preferred embodiment, the silicon film 5, which has the same dimensions as in the prior art, includes the first region (n-type diffusion layer 6) and the second region (region excluding the n-type diffusion layer 6). The second region includes a lower portion, which is located below the first region 6, and a peripheral portion, which surrounds the first region 6. The first region 6 in the silicon film 5 functions as an emitter layer. An emitter-base junction portion is formed beneath the emitter layer 6. The emitter-base junction has a width W$_{e3}$, which is less than the width of the interface between the silicon film 5 and the SiGe alloy layer 4 (corresponding to the width W$_{e2}$ of FIG. 14). The diffusion of n-type impurities into the silicon film 5 may be controlled to substantially equalize the width of the emitter layer 6, or the width W$_{e3}$ of the emitter-base junction, with the width W$_{e1}$. This enables the width W$_{e3}$ to be decreased without having to use a high accuracy exposure apparatus. When the width W$_{e3}$ of the emitter layer is less than the width W$_{e2}$ of the interface between the silicon film 5 and the SiGe alloy layer 4, the same current density is obtained with less current. Accordingly, in the preferred embodiment, a transistor having low power consumption is formed. As a result, a semiconductor device having a high capacity is obtained.

In the preferred embodiment, the contact surface 50 between the n-type diffusion layer 6 and the polycrystalline silicon film 7a is located above the lower surface 60 of the side wall film 9. Accordingly, in comparison to when the contact surface 50 is located at the same height as the lower surface 60 of the side wall film 9, the ratio of the n-type diffusion layer 6 (emitter layer) contacting the lower surface 60 of the side wall film 9 is reduced. This reduces parasitic capacitance of the emitter layer in the lower surface 60 of the side wall film 9 (so-called parasitic capacitance of peripheral components).

In the prior art configuration, a silicide film is directly formed on the side surface of the emitter layer 107. In the preferred embodiment, as shown in FIG. 2, the silicide film 8b is formed on the side surface of the silicon film 5. Thus, the emitter layer (n-type diffusion layer 6) does not come into contact with the silicide film 8b. The silicon film 5 functions as a buffer film during silicidation to prevent the emitter layer from being affected by silicidation conditions. Thus, the emitter layer is formed with a stable width. As a result, a semiconductor device having a high capacity is obtained.

The silicide film 8b is formed by silicidating the side surface of the silicon film 5, the side surface of the SiGe alloy layer 4, and the surface of the p$^+$ diffusion layer 10. Thus, the silicide film 8b has an L-shaped cross-section and includes the elevated wall 80, which extends along the side surfaces of the silicon film 5 and SiGe alloy layer 4. Accordingly, the base current flowing from the SiGe alloy layer 4 and silicon film 5 to the silicide film 8b is received by the elevated wall 80 of the silicide film 8b (side surfaces of the SiGe alloy layer 4 and silicon film 5). In the preferred embodiment, the concentration of current is mitigated in comparison to a flat silicide film that does not include the elevated wall 80 and includes only a horizontal portion that extends on the p$^+$ diffusion layer 10. This improves the capacity of the semiconductor device.

The procedures for manufacturing the semiconductor device of the preferred embodiment of the present invention will now be described with reference to FIGS. 3 to 11.

Figure 3:
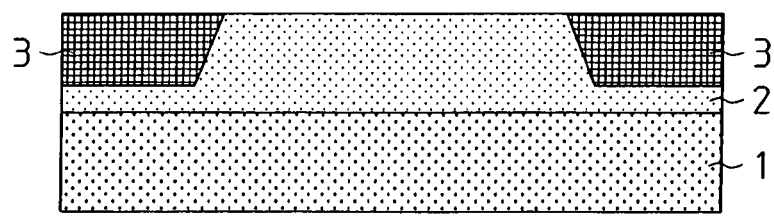
FIGS. 3 to 11 are cross-sectional views showing procedures for manufacturing the semiconductor device of FIG. 1.

[Process 1: FIG. 3] An element isolation region 3 is formed on the p-type silicon substrate 1 by performing, for example, STI. Then, n-type impurities are ion-implanted in part of the silicon substrate 1 and activated to form the collector layer 2. For example, phosphorous (P) is implanted with acceleration energy of approximately 500 to 4000 keV to obtain a concentration of about $3 \times 10^{13}$ cm$^{-2}$ to $3 \times 10^{15}$ cm$^{-2}$.

The collector layer 2 may be a silicon epitaxial layer formed by doping impurities in the silicon substrate 1. In this case, the element isolation regions 3 may be formed by performing STI or the like after formation of the silicon epitaxial layer.

Figure 4:
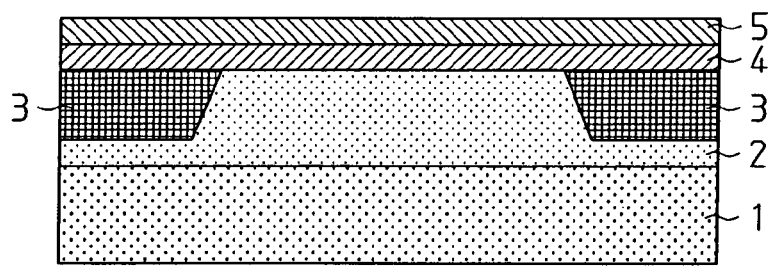

[Process 2: FIG. 4] Low pressure chemical vapor deposition (CVD) is performed to epitaxially grow the silicon-germanium (SiGe) alloy layer 4, in which boron (B) is doped at a concentration of approximately $1 \times 10^{19}$ cm$^{-3}$, and the silicon film 5, which does not contain germanium (Ge), in a sequential manner. The SiGe alloy layer 4 and the silicon film 5 each have a thickness of approximately 10 nm to 100 nm. Epitaxial growth is performed so that the SiGe alloy layer 4 is formed to have the same lattice constant as the underlayer substrate (p-type silicon substrate 1). The silicon film 5 formed on the SiGe alloy layer 4 also has a lattice constant reflecting the lattice constant of the underlayer SiGe alloy layer 4.

The Ge concentration in the SiGe alloy layer 4 may be uniform throughout the layer. Alternatively, the Ge concentration in the SiGe alloy layer 4 may vary from the surface contacting the silicon film 5 towards the surface contacting the collector layer 2. For example, the Ge concentration of the SiGe alloy layer 4 may have an inclined doping profile that gradually increases from the side contacting the silicon film 5 toward the collector layer 2. This would shorten the time electrons travel through the base and form a transistor that operates at high speeds. In such a case, it is preferred that the Ge concentration substantially be about 0% at the side contacting the silicon film 5 and about 15% to 20% at the side contacting the collector layer 2.

The silicon film 5 may either be doped with boron (B), in the same manner as the SiGe alloy layer 4, or not doped with boron.

Further, prior to formation of the SiGe alloy layer 4, low pressure CVD may be performed to epitaxially grow a silicon film that does not include boron (B) or an SiGe alloy layer that does not include boron (B).

Figure 5:
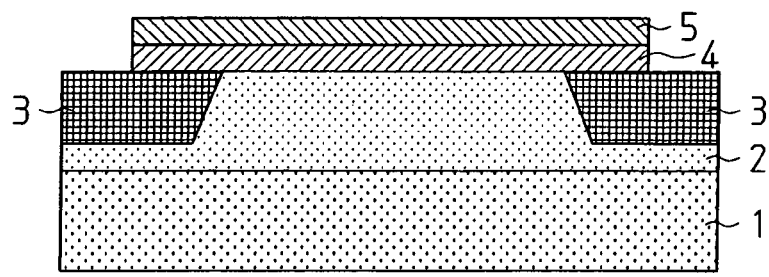

[Process 3: FIG. 5] Next, lithography is performed to form a resist pattern. Then, dry etching is performed using the resist pattern as a mask to remove unnecessary portions from the silicon film 5 and the SiGe alloy layer 4.

Figure 6:
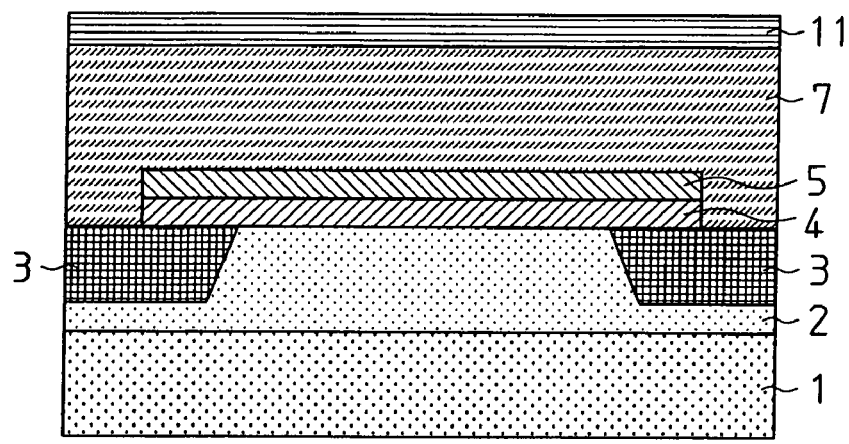

[Process 4: FIG. 6] Low pressure CVD is performed to form a polycrystalline silicon film 7, which is doped with n-type impurities of approximately $1 \times 10^{20}$ cm$^{-3}$ or more, and a silicon nitride film 11. Examples of the n-type impurities are arsenic (As) and phosphorus (P). The thickness of the polycrystalline silicon film 7 is approximately 100 nm to 300 nm. The thickness of the silicon nitride film 11 is approximately 50 nm to 200 nm.

Figure 7:
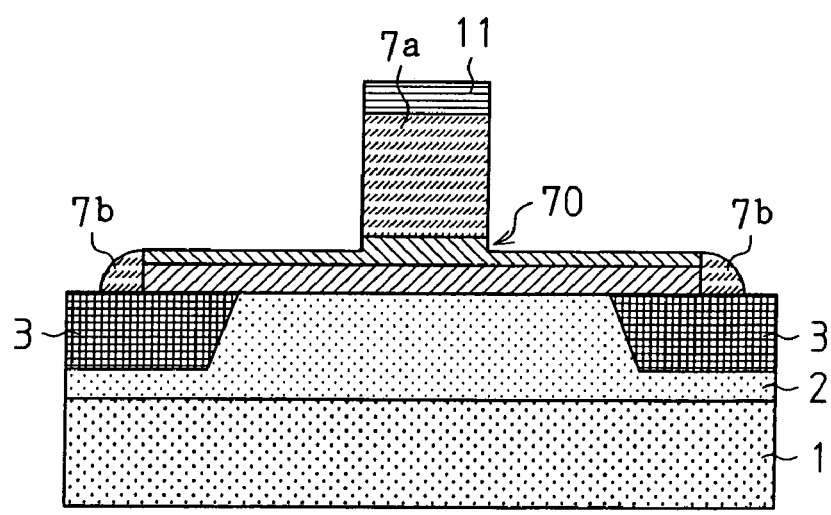

[Process 5: FIG. 7] Lithography is performed to form a resist pattern on the silicon nitride film 11. Then, dry etching is performed using the resist pattern as a mask to sequentially remove the silicon nitride film 11, the polycrystalline silicon film 7, and the silicon film 5. Dry etching is performed so as not to completely remove the silicon film 5 and is terminated in a state in which the silicon film 5 partially remains on the entire surface of the SiGe alloy layer 4. As a result, the silicon film 5 becomes a reversed T-shaped layer 70. In this state, the polycrystalline silicon film 7 is processed to form the polycrystalline silicon film 7a, which functions as an emitter electrode, and the side wall film 7b, which surrounds the SiGe alloy layer 4 and the silicon film 5.

[Process 6: FIG. 8] CVD is performed to form a silicon oxidation film. The silicon oxidation film is formed by, for example, heating a gas mixture of tetraethoxysilane (TEOS) and oxygen (O$_2$) under a temperature of 720° C. The thickness of the silicon oxidation film is approximately 100 nm to 400 nm.

Then, dry etching is performed to carry out complete surface etch back and form the side wall film 9, which is formed from part of the silicon oxidation film. The side wall film 9 surrounds the side surface of the silicon nitride film 11, the side surface of the polycrystalline silicon film 7a, and the side surface of the projection of the silicon film 5. The side wall film 9 is a so-called side wall.

The silicon film 5 and the SiGe alloy layer 4 are etched to a predetermined depth using the silicon nitride film 11 and the side wall film 9 as a mask. As a result, the SiGe alloy layer 4 has a reversed T-shaped cross-section with a side surface that is transverse to the semiconductor substrate 1. The ideal elevated wall 80 is orthogonal to the semiconductor substrate 1. However, during actual fabrication of the semiconductor device, the elevated wall 80 may have a curved surface or a flat surface, which is inclined relative to the semiconductor substrate 1. As long as the outer surface of the elevated wall 80 has vertical component, the same advantages as when the elevated wall 80 is orthogonal to the semiconductor substrate 1 would be obtained even if the elevated wall 80 has a curved surface or a flat surface inclined relative to the semiconductor substrate 1. In this specification, the "elevated wall 80" is not limited to a wall having a flat surface that is orthogonal to the semiconductor substrate 1 and is defined as a wall including a surface that extends upward from the semiconductor substrate 1. The peripheral portion of the SiGe alloy layer 4 that is not masked by the silicon nitride film 11 and the side wall film 9 is not completely removed. This is to prevent short-circuiting between the collector substrate and the base electrode during formation of the silicide films 8a and 8b. Prior to the formation of the SiGe alloy layer 4, when performing low pressure CVD to epitaxially grow a silicon layer that does not contain boron or an SiGe alloy layer that does not contain boron, the peripheral portion of the SiGe alloy layer 4 may be completely removed.

Figure 9:
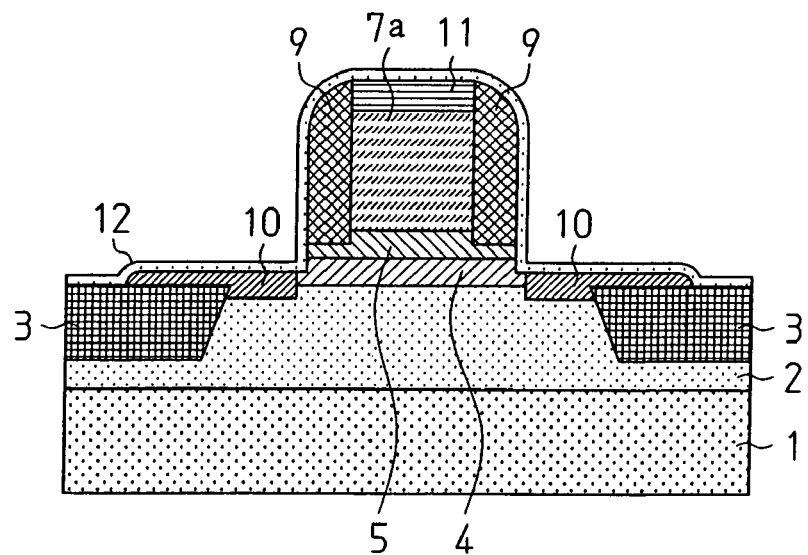

[Process 7: FIG. 9] Low pressure CVD is performed to form a silicon oxidation film 12 on the entire surface. Boron (B) is ion-implanted and then activated by performing a heat treatment to form the p$^+$ diffusion layer 10, which functions as an external base layer. The ion implantation is performed by implanting BF$_2$ at an amount of $1 \times 10^{14}$ cm$^{-2}$ to $5 \times 10^{15}$ cm$^{-2}$ with an acceleration energy of 1 keV to 30 keV. Under this implantation condition, ions do not pass through the silicon nitride film 11, which is arranged on the polycrystalline silicon film 7a and has a thickness of about 100 nm. Thus, boron is not implanted into the polycrystalline silicon film 7a.

The p$^+$ diffusion layer 10 is formed by implanting ions in the peripheral portion of the SiGe alloy layer 4 and part of the collector layer 2. Thus, the p$^+$ diffusion layer 10 includes silicon (Si).

Figure 10:
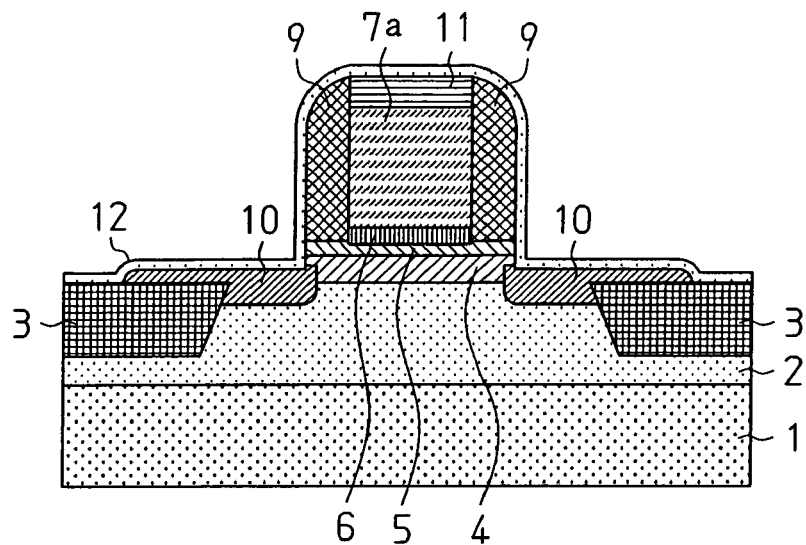
Figure 11:
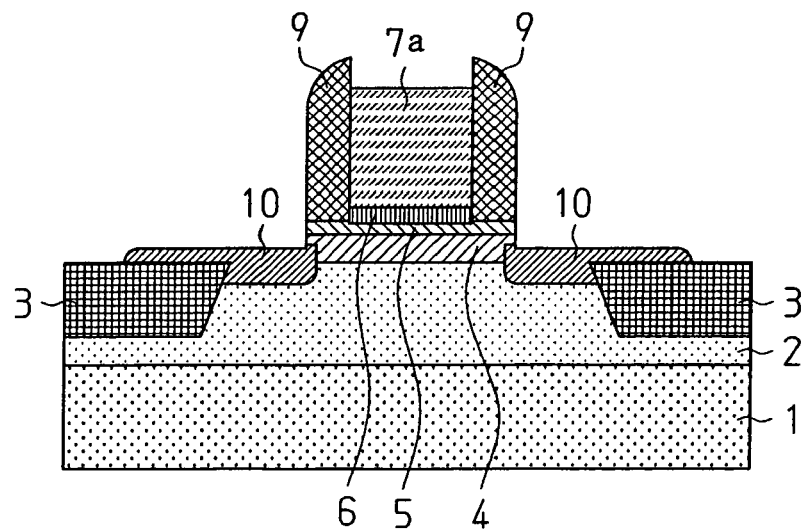

[Process 8: FIG. 10] Heat treatment is performed to diffuse the n-type impurities of the polycrystalline silicon film 7a into the silicon film 5 and form the n-type diffusion layer 6. As a result, the emitter base junction is formed in the silicon film 5. The heat treatment is performed with a rapid thermal annealing (RTA) apparatus under a temperature of about 1050° C. for a period of 5 to 30 seconds.

The emitter layer (n-type diffusion layer 6), which is formed in the silicon film 5, is formed by diffusing n-type impurities from the polycrystalline silicon film 7a. However, the diffusion occurs in the lateral direction in addition to the depth-wise direction. Thus, the effective emitter width may become greater than the width of the polycrystalline silicon film 7a. However, in the preferred embodiment, the side wall film 9 functions as a diffusion barrier and prevents diffusion of the n-type diffusion layer 6. More specifically, the side wall film 9 covering the side surface of the projection of the silicon film 5 prevents diffusion of the n-type diffusion layer 6 in the lateral direction. This minimizes the width of the emitter layer. Further, the amount (ratio) of n-type impurities that reach a position below the lower surface 60 of the side wall film 9 decreases. This lowers the parasitic capacitance (so-called parasitic capacitance of peripheral components) of the emitter layer.

[Process 10: FIG. 1] A cobalt (Co) layer is formed on the upper surface of the polycrystalline silicon film 7a, the side surface of the SiGe alloy layer 4, and the surface of the p$^+$ diffusion layer 10. The cobalt layer is heat treated to form cobalt silicide films (silicide films 8a and 8b). The sheet resistance of the silicide films 8a and 8b is approximately 5 Ω/square. The sheet resistance of the silicide films 8a and 8b is much smaller than the sheet resistance of the prior art p$^+$ type SiGe layer and p$^+$ diffusion layer 19 that is approximately 100 Ω/square. Thus, the silicide films 8a and 8b lower the parasitic resistance produced between the internal base layer and the base electrode (not shown), which is connected to the external base layer.

In the preferred embodiment, as shown in FIG. 1, the silicide film 8b is formed on the side surface of the silicon film 5 and does not directly contact the emitter layer (n-type diffusion layer 6). Thus, the dimensions of the n-type diffusion layer 6 do not change during silicidation, and the emitter layer is formed with a stable width.

The silicide film 8b is formed by silicidating the side surface of the silicon film 5, the side surface of the SiGe alloy layer 4, and the surface of the p$^+$ diffusion layer 10. Thus, the silicide film 8b includes an elevated wall 80 having an L-shaped cross-section. The base current flowing from the SiGe alloy layer 4 and the silicon film 5 to the silicide film 8b is received by the elevated wall 80 of the silicide film 8b (the silicide film 8b applied to the side surfaces of the SiGe alloy layer 4 and the silicon film 5). In the semiconductor device of the preferred embodiment, current concentration is mitigated in comparison to when the silicide film includes only a horizontal portion.

In process 10, a titanium (Ti) layer may be formed in lieu of the cobalt (Co) layer. In this case, silicidation is performed to form a titanium silicide film. A semiconductor device including a titanium silicide film has the same advantages as those of the preferred embodiment.

Although not shown in the drawings, an interlayer insulation film, such as a plasma TEOS film, may be deposited on the surface of a semiconductor substrate. Further, a contact hole may be formed in a collector electrode, base electrode, and emitter electrode of an NPN transistor. Then, a bimetal layer, made of titanium or the like, and a conductive layer, made of aluminum or aluminum alloy, may be formed. This manufactures a bipolar transistor having an NPN transistor.

Figure 12:
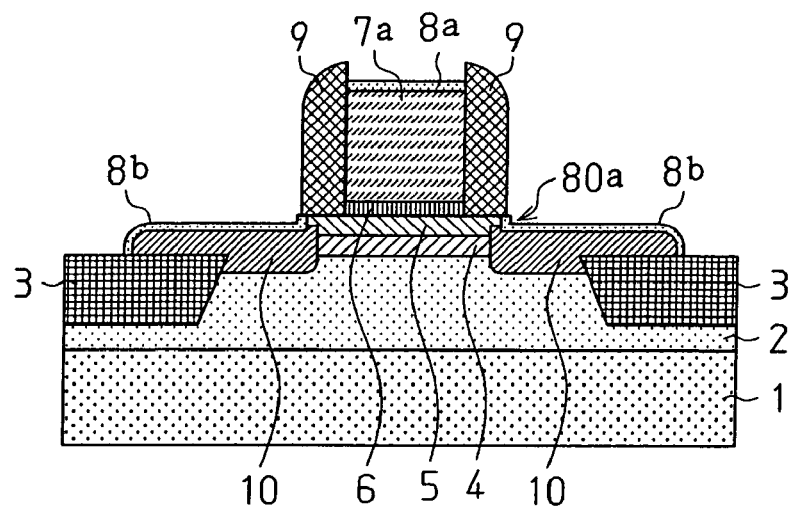
FIG. 12 is a cross-sectional view showing a modification of the semiconductor device shown in FIG. 1.
Figure 13:
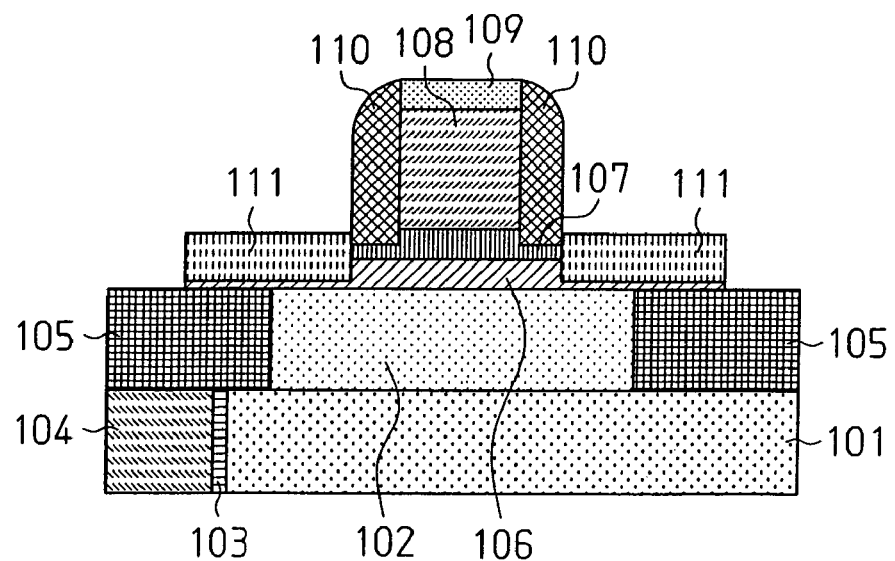
FIG. 13 is a cross-sectional view showing an SiGe base heterojunction bipolar transistor of the prior art.

FIG. 12 is a cross-sectional view showing a modification of the semiconductor device of FIG. 1. The semiconductor device includes a silicide film 8b, which includes an elevated wall 80a and covers the side surface of a silicon film 5 and the surface of a p$^+$ diffusion layer 10. The elevated wall 80a does not contact the side surface of an SiGe alloy layer 4. More specifically, the upper surface of the p$^+$ diffusion layer 10 is flush with or higher than the upper surface of the SiGe alloy layer 4. Thus, the side surface of the SiGe alloy layer 4 contacts the p$^+$ diffusion layer 10 but does not contact the elevated wall 80a of the silicide film 8b. The semiconductor device of FIG. 12 has the same advantages as the semiconductor device of FIG. 1.

The present invention may be applied to various types of bipolar transistors.

It should be apparent to those skilled in the art that the present invention may be embodied in many other specific forms without departing from the spirit or scope of the invention. Therefore, the present examples and embodiments are to be considered as illustrative and not restrictive, and the invention is not to be limited to the details given herein, but may be modified within the scope and equivalence of the appended claims.

What is claimed is:

1. A semiconductor device comprising:
   a semiconductor substrate;
   a collector layer formed on the semiconductor substrate;
   a silicon-containing conductive layer formed on the collector layer and including a side surface; and
   a silicon film formed on the silicon-containing conductive layer and including a first region, which functions as an emitter layer, and a second region including a side surface;
   an emitter electrode formed on the silicon film and including a side surface and a bottom surface, in which the bottom surface contacts the first region of the silicon film;
   a side wall film covering the side surface of the emitter electrode and including a lower surface, the bottom surface of the emitter electrode being further from the substrate than the lower surface of the side wall film, and at least part of the second region of the silicon film being located between the silicon-containing conductive layer and the side wall film and contacting both the silicon-containing conductive layer and the side wall film;
   an impurity region containing silicon formed adjacent to the silicon-containing conductive layer, the impurity region functioning as an external base layer and including a surface; and
   a silicide film formed along the side surface of the second region, the side surface of the silicon-containing conductive layer, and the surface of the impurity region.

2. The semiconductor device according to claim 1, wherein the first region is formed by thermally diffusing impurities from the emitter electrode into the silicon film.

3. The semiconductor device according to claim 1, wherein:
   the surface of the impurity region includes an upper surface parallel to the semiconductor substrate, and the side surface of the second region and the side surface of the silicon-containing conductive layer are orthogonal to the upper surface of the impurity region; and
   the silicide film includes a horizontal portion covering the upper surface of the impurity region and an elevated portion covering the side surface of the second region and the side surface of the silicon-containing conductive layer, with the elevated portion being transverse to the horizontal portion.

4. The semiconductor device according to claim 3, wherein the silicon-containing conductive layer and the silicon film each have an outer dimension measured along a plane parallel to the semiconductor substrate, with the outer dimension of the silicon-containing conductive layer being equal to the outer dimension of the silicon film.

5. The semiconductor device according to claim 3, wherein the lower surface of the side wall film contacts the first and second regions of the silicon film and an upper end of the elevated portion.

6. The semiconductor device according to claim 1, wherein the lower surface of the side wall film contacts both the first region and the second region of the silicon film.

7. The semiconductor device according to claim 1, wherein:
the first region is located in the middle of the silicon film;
the second region includes a lower portion, which is located below the first region, and a peripheral portion, which surrounds a periphery of the first region, with the side surface of the second region being a periphery of the peripheral portion;
the emitter electrode has a first width measured along a plane parallel to the semiconductor substrate; and
the side wall film is a cylindrical side wall extending along the side surface of the emitter electrode, the side wall having a second width measured along a plane parallel to the semiconductor substrate; and
the first region includes a lower surface having a third width measured along a plane parallel to the semiconductor substrate, with the third width being greater than the first width and less than the second width.

8. A semiconductor device comprising:
a semiconductor substrate;
a collector layer formed on the semiconductor substrate;
a silicon-containing conductive layer formed on the collector layer and including a side surface; and
a silicon film formed on the silicon-containing conductive layer and including a first region, which functions as an emitter layer, and a second region including a side surface;
an emitter electrode formed on the silicon film and including a side surface and a bottom surface, in which the bottom surface contacts the first region of the silicon film;
a side wall film covering the side surface of the emitter electrode and including a lower surface, the bottom surface of the emitter electrode being further from the substrate than the lower surface of the side wall film, and at least part of the second region of the silicon film being located between the silicon-containing conductive layer and the side wall film and contacting both the silicon-containing conductive layer and the side wall film;
an impurity region containing silicon formed adjacent to the silicon-containing conductive layer, the impurity region functioning as an external base layer and including a surface; and
a silicide film formed along the side surface of the second region and the surface of the impurity region.

9. The semiconductor device according to claim 8, wherein the first region is formed by thermally diffusing impurities from the emitter electrode into the silicon film.

10. The semiconductor device according to claim 8, wherein:
the surface of the impurity region includes an upper surface parallel to the semiconductor substrate, and the side surface of the second region and the side surface of the silicon-containing conductive layer are transverse to the upper surface of the impurity region; and
the silicide film including a horizontal portion covering the upper surface of the impurity region and an elevated portion covering the side surface of the second region and the side surface of the silicon-containing conductive layer, with the elevated portion being transverse to the horizontal portion.

11. The semiconductor device according to claim 10, wherein the silicon-containing conductive layer and the silicon film each have an outer dimension measured along a plane parallel to the semiconductor substrate, with the outer dimension of the silicon-containing conductive layer being smaller than the outer dimension of the silicon film.

12. The semiconductor device according to claim 11, wherein the lower surface of the side wall film contacts the first and second regions of the silicon film and an upper end of the elevated portion.

13. The semiconductor device according to claim 9, wherein the lower surface of the side wall film contacts both the first region and the second region of the silicon film.

14. The semiconductor device according to claim 9, wherein:
the first region is located in the middle of the silicon film;
the second region includes a lower portion, which is located below the first region, and a peripheral portion, which surrounds a periphery of the first region, with the side surface of the second region being a periphery of the peripheral portion;
the emitter electrode has a first width measured along a plane parallel to the semiconductor substrate; and
the side wall film is a cylindrical side wall extending along the side surface of the emitter electrode, with the side wall having a second width measured along a plane parallel to the semiconductor substrate; and
the first region includes a lower surface having a third width measured along a plane parallel to the semiconductor substrate, with the third width being greater than the first width and less than the second width.

* * * * *